United States Patent
Khusnatdinov et al.

(10) Patent No.: US 11,054,739 B2
(45) Date of Patent: Jul. 6, 2021

(54) IMPRINT APPARATUS, CONTROL METHOD, IMPRINT METHOD AND MANUFACTURING METHOD

(71) Applicant: CANON KABUSHIKI KAISHA, Tokyo (JP)

(72) Inventors: Niyaz Khusnatdinov, Round Rock, TX (US); Mario Johannes Meissl, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 417 days.

(21) Appl. No.: 16/046,810

(22) Filed: Jul. 26, 2018

(65) Prior Publication Data

US 2020/0033720 A1    Jan. 30, 2020

(51) Int. Cl.
*G03F 7/00* (2006.01)
*H01L 21/324* (2006.01)

(52) U.S. Cl.
CPC ........ *G03F 7/0002* (2013.01); *H01L 21/3247* (2013.01)

(58) Field of Classification Search
CPC .............................. G03F 7/0002; H01L 21/3247
See application file for complete search history.

(56) References Cited

U.S. PATENT DOCUMENTS

| 10,534,259 | B2 | 1/2020 | Choi et al. | |
| 2011/0163477 | A1* | 7/2011 | Butler | F16F 15/0275 264/293 |
| 2013/0182236 | A1* | 7/2013 | De Schiffart | B29C 43/14 355/74 |
| 2015/0153659 | A1* | 6/2015 | Nawata | G03F 7/709 355/72 |
| 2016/0005568 | A1* | 1/2016 | Mizuochi | H01J 37/20 250/442.11 |

FOREIGN PATENT DOCUMENTS

JP    2004111684 A  *  4/2004

* cited by examiner

*Primary Examiner* — Jacob T Minskey
*Assistant Examiner* — Virak Nguon
(74) *Attorney, Agent, or Firm* — Canon U.S.A., Inc., IP Division

(57) ABSTRACT

An apparatus and method configured to stabilize imprint head temperature. The apparatus and method includes an imprinting apparatus including, a mount attached to a fixed surface, a movable plate movable relative to the mount, at least one electromagnetic actuator mounted between the movable plate and the mount, wherein an electrical current is applied to the at least one electromagnetic actuator for controlling movement of the moveable plate, and wherein a root-mean-square of the electrical current applied to the at least one electromagnetic actuator in an idle state is equal to a root-mean-square of the electrical current applied to the at least one electromagnetic actuator during a continuous imprinting state.

20 Claims, 5 Drawing Sheets

IMPRINT APPARATUS, CONTROL METHOD, IMPRINT METHOD AND MANUFACTURING METHOD

BACKGROUND OF THE INVENTION

Field of the Invention

The present disclosure relates to nanoimprint technology including imprint heads for use in nanoimprint lithography.

Description of the Related Art

In the semiconductor fabrication field, the use of advanced semiconductor lithography is fast becoming the standard. Nanoimprint lithography techniques are known to possess remarkable replication capability down to sub-3 nm resolution, and sub-7 nm half-pitch. In this regard, nanoimprint lithography is unusual in the capability it offers as compared to other technologies; its resolution is unmatched, approaching molecular scale. Additionally, as compared to photolithography (PL) which has been the workhorse in the semiconductor and display fabrication industries, nanoimprint lithography's resolution is largely unaffected by the field size being patterned, which has the potential to lead to high-throughput nanoimprint lithography processes.

Translating the above molecular-scale replication resolution to a commercially viable IC manufacturing process, however, requires addressing a variety of process performance concerns that present themselves. Some of the main concerns being misalignment and overlay errors caused by thermal expansion of a template or, temperature induced flatness distortion of a template.

With unstable imprint head temperature there is degradation in alignment and overlay. Additionally, concerns arise due to changes in imprint head voice coil currents causing Joule heating in the coil, load on voice coils is generally different during continuous imprinting and imprint head idling periods, and long time periods (on order of ~1 hour) required to reach new steady state temperatures after imprinting starts.

SUMMARY OF THE INVENTION

The various embodiments of the present nanoimprint temperature stabilizing apparatus and method, have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description of the Embodiments," one will understand how the features of the present embodiments provide the advantages described herein.

In a first embodiment, an imprinting apparatus includes, a mount attached to a fixed surface, a movable plate movable relative to the mount, at least one electromagnetic actuator mounted between the movable plate and the mount, wherein an electrical current is applied to the at least one electromagnetic actuator for controlling movement of the moveable plate, and wherein a root-mean-square of the electrical current applied to the at least one electromagnetic actuator in an idle state is equal to a root-mean-square of the electrical current applied to the at least one electromagnetic actuator during a continuous imprinting state.

In another embodiment, an imprint method, the method including, providing an imprint template on a moveable surface, controlling movement of the movable surface using at least one electromagnetic actuator, applying, during an idle state, an electrical current to the at least one electromagnetic actuator to maintain the moveable plate a predetermined distance from a substrate, wherein the root-mean-square of the electrical current applied to the at least one electromagnetic actuator during an idle state is equal to a root-mean-square of the electrical current applied to the at least one electromagnetic actuator during a continuous imprinting state.

DETAILED DESCRIPTION OF THE EMBODIMENTS

Example devices, methods and systems are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the figures should not be viewed as limiting. It should be understood that other embodiments might include more or less of each element shown in a given figure. Further, some of the illustrated elements may be combined or omitted. Yet further, an example embodiment may include elements that are not illustrated in the figures.

Because there is a need to control imprint head temperature, exemplary embodiments of the present disclosure provide for accurately controlling temperature of an imprint head during idle or intermittent imprint periods to keep the imprint head activated with the same rms current as during continuous imprinting to maintain the same average voice coil power during idling and imprinting. Pursuant to these exemplary embodiments, tool idle temperature can be set to match tool active temperature by selecting a specific imprint head idle position. This improves imprint head temperature stability.

Figure 1:
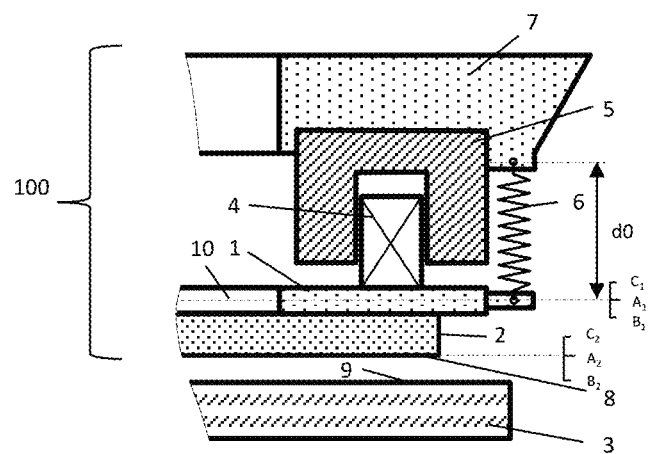
FIG. 1 is a plan view of an imprint head for a nanoimprint lithography system according to an exemplary embodiment of the present disclosure.

FIG. 1 depicts an imprint head for a nanoimprint lithography system according to an exemplary embodiment of the present disclosure. The nanoimprint lithography system includes, but is not limited to, an imprint head 100, moving plate 1, imprint template 2, substrate 3, a control unit to control current or voltage applied to an electromagnetic actuator with voice coil 4 and magnet 5, spring 6, fixed body 7, first plane 8, substrate surface 9 and second plane 10. The imprint head 100 is a mountable control head with the ability to translate in the Z-direction and rotate about in the X and/or Y direction in relation to substrate 3.

The moving plate 1 attaches to fixed body 7 via spring 6 and allows suspension in an equilibrium position or any other specified position. Moreover, moving plate 1 holds imprint template 2 a set distance from substrate 3 and is attached to the electromagnetic actuator. In another embodiment, moving plate 1 remains in a fixed position utilizing force applied to a fixed surface to block motion. This includes but is not limited, a locking type mechanism, bump stop, mechanical interlock, etc. Moving plate 1 can be but is not limited to, a construction from different materials. For example, it may consist of a silicon carbide body with a bonded fused silica air cavity window, and metal components. In this case, these materials all have dissimilar thermal expansion coefficients and as a result, imprint head 100 temperature changes may cause the flatness of moving plate 1 to change. The moving plate 1 can move unevenly, some parts of the plate can move different distances and different directions in relation to the substrate 3. Accordingly, this causes the template 2 position and shape to change, causing overlay distortions.

Imprint template 2 attaches to the moving plate 1 where its bottom edge is first plane 8. It is able to move down from position A2 to position B2, which is at substrate surface 9, or up to the position C2 where the distance A1 to B1 is equal to the distance A2 to B2 and the distance A1 to C1 is equal to the distance A2 to C2.

Substrate 3 can be any acceptable solid material for nanoimprint lithography with upper edge being substrate surface 9 positioned below first plane 8 a set distance.

As mentioned above, voice coil 4 and magnet 5 make up an example electromagnetic actuator and are controlled by the control unit. Moreover, the control unit may obtain rms current in an imprinting state and control current in idle state based on the obtained rms current. In this example, the electromagnetic actuator is positioned between fixed body 7 and moving plate 1 with the voice coil 4 side attached to moving plate 1. However, the sides of the electromagnetic actuator can also be reversed with the voice coil 4 side being attached to the fixed body 7. The electromagnetic actuator allows an electric current to flow through voice coil 4 creating a magnetic field and magnetic moments with magnet 5. Voice coil 4 can be, but is not limited to, being in the center of and surrounded by magnet 5 allowing vertical movement up and down within a specified range. In another embodiment, magnet 5 is centrally positioned within and surrounded by voice coil 4 allowing the same vertical type movement.

As described above, electric current is applied to the electromagnetic actuator causing attraction or repulsion between the voice coil 4 and the magnet 5 depending on the direction of the electric current. Accordingly, the interaction causes vertical movement of the electromagnetic actuator and the moving plate 1. In another embodiment, there is a plurality of electromagnetic actuators with voice coils 4 and magnets 5 and displacement of each voice coil 4 and magnet 5 pair can be different.

Spring 6 can be but is not limited to, an elastic object that stores mechanical energy. When spring 6 extends from its resting position, it exerts an opposing force approximately proportional to its change in length. Its design can vary from that which is shown for exemplary purposes. At the resting position, spring 6 has length equal to d0 measured from the connection point at the fixed body 7 to the second plane 10. In addition, in another embodiment, there is a plurality of springs 6 corresponding to the number of voice coils 4 and magnets 5.

Spring 6 is attached to moving plate 1 at second plane 10 on one end and fixed body 7 at the other end allowing moving plate 1 and imprint template 2 to be suspended at equilibrium a fixed distance from substrate 3. At the equilibrium position, first plane 8 is at position A2 and second plane 10 is at position A1.

Due to many factors, misalignment of imprint template 2 and overlay errors can occur. One of these factors can be thermal expansion of the imprint template 2. Although the imprint template 2 is preferably fused silica with a very low coefficient of thermal expansion, a slight change in the temperature can produce several nanometers of misalignment, some of which can be non-linear and difficult to resolve.

Moreover, moving plate 1 may consist of different materials. For example, it may consist of a silicon carbide body with a bonded fused silica air cavity window, and metal components. Since these materials each have different thermal expansion coefficients, changes in imprint head 100 temperature can cause moving plate 1 to shift position and not remain flat. Thus, flatness of imprint template 2 in the equilibrium state may change causing overlay distortions.

Additionally, overlay distortions may occur when imprint template 2 and substrate 3 are at different temperatures. For example, heat may flow from imprint template 2 locally to the substrate 3 during imprinting and locally heat substrate 3. This too may cause nonlinear overlay distortions.

Lastly, if the tool including the imprint head 100 is in idle state there is little or no electric current flowing through voice coil 4; typically if any current is applied it is only enough to maintain moving plate 1 at a desired idle position. This is in contrast to when imprint head 100 is in a continuous imprinting state, i.e., where continuous imprint cycles are performed such as when in use for production, when there is a significant average electrical current flowing through the voice coil 4. Maximum electrical current happens when imprint template 2 is at position B2 in contact with the substrate 3. The electrical current causes the voice coil 4 to heat up due to joule heating heat which in turn also heats surrounding imprint head 100 parts such as magnet 5, moving plate 1, and imprint template 2. A typical transient time for the template 3 temperature to rise to a steady state or to cool down to a steady state is in the range of 30 minutes to 1 hour, or in the range of 10 minutes to 2 hours.

As the tool state is often unpredictable, the embodiments described below aim to maintain template 3 temperature.

Figure 2:
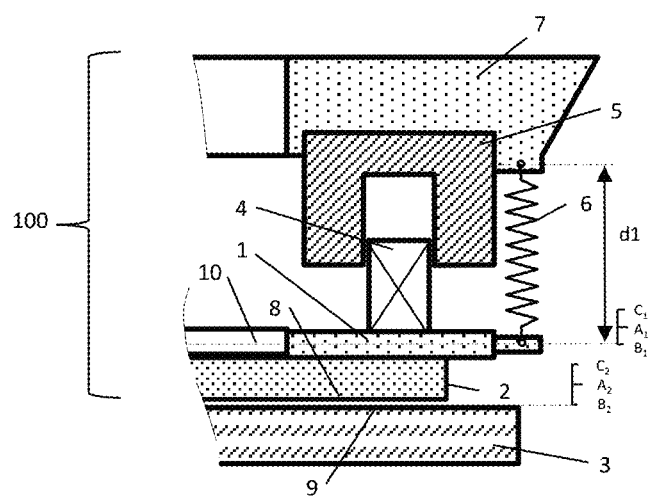
FIG. 2 is a plan view of an imprint head for a nanoimprint lithography system according to a first embodiment of the present disclosure.

FIG. 2 is a plan view of an imprint head of a nanoimprint lithography system in an activated voice coil state according to an exemplary embodiment of the present disclosure.

In this embodiment, voice coil 4 is constantly activated with an average electrical current corresponding to the average electrical voice coil 4 power (of the form $I^2R$) during continuous imprinting. This is equal to the rms (root-mean-square) current during imprinting, which is of the form:

$$I_{rms} = \sqrt{\frac{\int_0^T I^2(t)\,dt}{T}}$$

Where, I(t) is the instantaneous voice coil 4 current measured over a time interval T after which the voice coil 4 current repeats during continuous imprinting (for example, one imprint cycle where a single imprint upon a substrate is performed by process of contacting the template with a resin on one field of the substrate, curing the resin and separating the template from the cured resin, or one substrate cycle where all fields on a substrate are imprinted in a step-and-repeat process, including loading and unloading of the substrate). The time interval T can also be the imprint tool active imprint time.

As such, imprint template 2 moves in the downward direction with first plane 8 moving from position A2 towards B2 when the tool is idling to maintain the desired average electrical current. Correspondingly, moving plate 1 moves in the downward direction from position A1 towards B1 and spring 6 extends to length d1. An ideal position is reached when the force exerted by spring 6 requires a current equal to the rms current during continuous imprinting.

Figure 3:
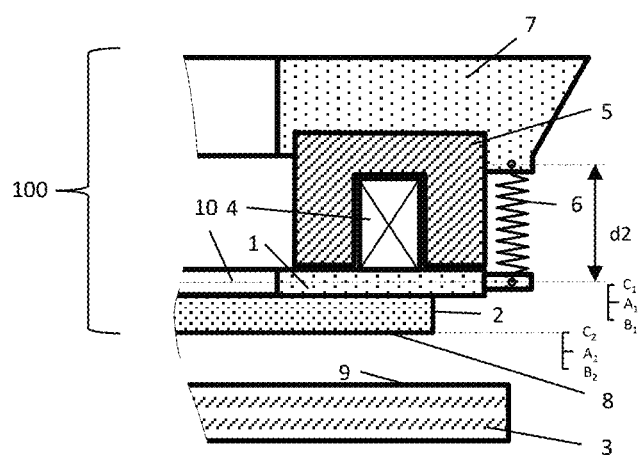
FIG. 3 is a plan view of an imprint head for a nanoimprint lithography system according to a second embodiment of the present disclosure.

FIG. 3 is a plan view of an imprint head of a nanoimprint lithography system in an activated voice coil state according to another exemplary embodiment of the present disclosure.

Similar to the embodiment described in FIG. 2, in this embodiment, voice coil 4 is constantly activated with an average electrical current corresponding to the average electrical voice coil 4 power (of the form $I^2R$) during continuous imprinting. This is equal to the rms current during imprinting.

In this embodiment, imprint template 2 moves in the upward direction with first plane 8 moving from position A2 towards C2 when the tool is idling to maintain the desired average electrical current. Correspondingly, moving plate 1 moves in the upward direction from position A1 towards C1 away from substrate 3 and spring 6 compresses to length d2. An ideal position is calculated based on the required average voice coil 4 current that equals the rms voice coil 4 current during continuous imprinting.

Figure 4:
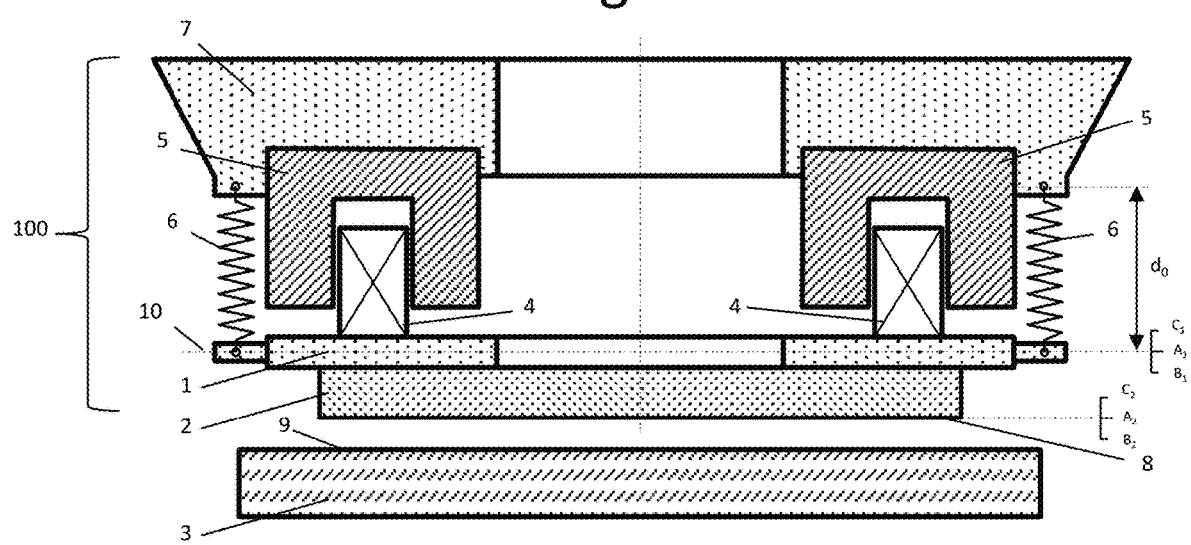
FIG. 4 is a simplified view of an imprint head including a plurality of electromagnetic actuators according to a third embodiment of the present disclosure.

FIG. 4 is a simplified view of an imprint head including multiple electromagnetic actuators with a plurality of voice coils 4 and magnets 5 according to another exemplary embodiment of the present disclosure.

In this embodiment, individual components are similar to the embodiment described in FIG. 1. As such, detailed descriptions of each and their respective operations are omitted. In this embodiment, there is a plurality of voice coils 4, magnets 5 and springs 6 with the number of voice coils 4 corresponding to the number of magnets 5.

Here, moving plate 1 is continuous and contains the plurality of magnets 4, and fixed body 7 extends as a continuous body containing the plurality of magnets 5. Accordingly, imprint template 2 is controlled by the movement and positioning of the plurality of voice coils 4 in conjunction with the plurality of magnets 5 and plurality of springs 6.

In this configuration, electrical current is applied to the plurality of voice coils 4 creating magnetic fields and magnetic moments. In an idle or standby state, each voice coil 4 and magnet 5 pair will be controlled individually to match the heat (power) produced by each pair during a normal operation state. This ensures precise control of the temperature in each pair location.

Figure 5A:
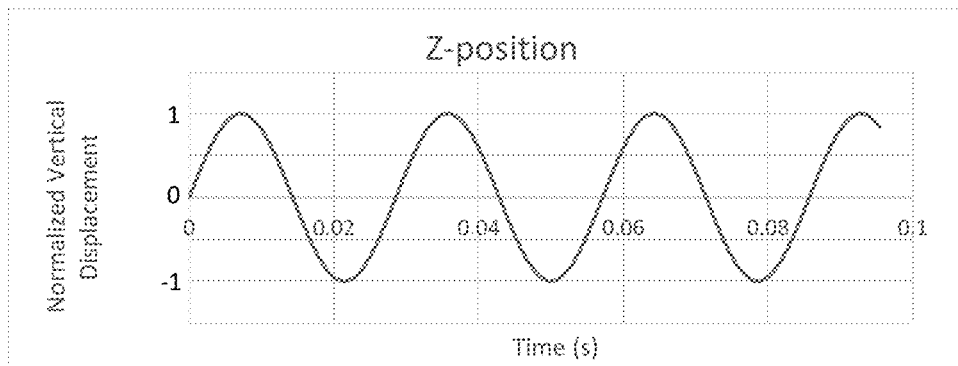
FIGS. 5A-5C are timing diagrams where the imprint head oscillates in an idle state according to a fourth embodiment of the present disclosure.
Figure 5B:
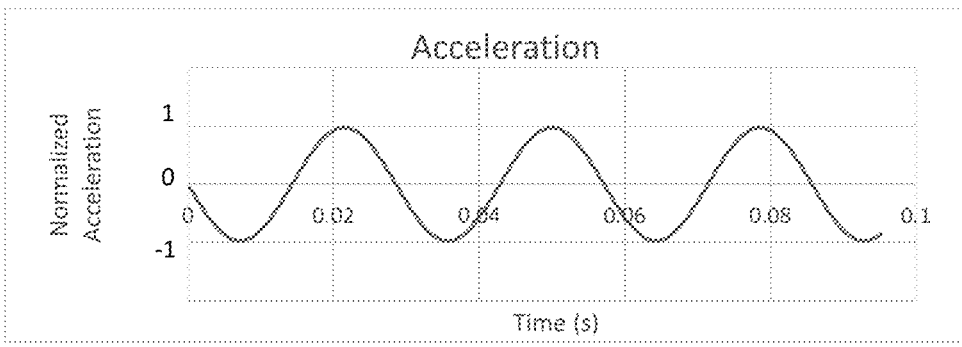
Figure 5C:
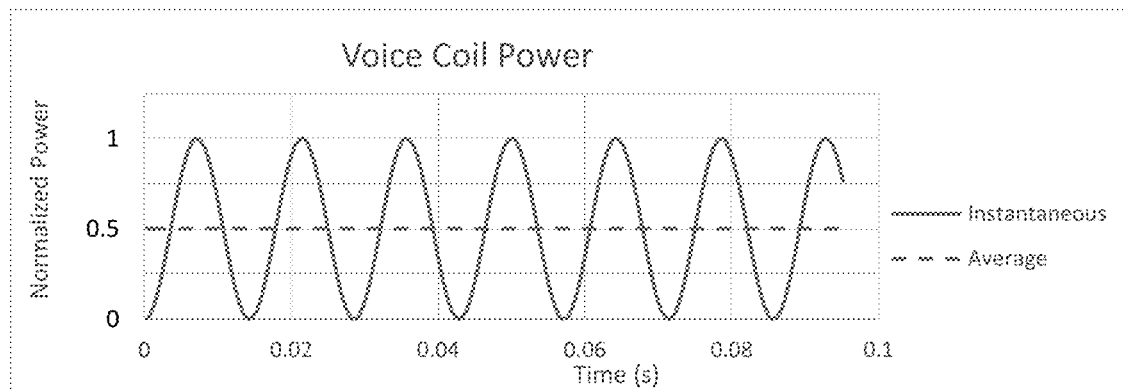

FIGS. 5A-5C are timing diagrams where moving plate 1 oscillates during idle periods according to another exemplary embodiment of the present disclosure. Referring to FIG. 1 in this example, during an idle period, moving plate 1 oscillates in the Z-direction as shown in FIG. 5A. This causes a sinusoidal acceleration of the voice coil 4 with the profile shown in FIG. 5B with respect to time. To achieve this type of oscillation, the average voice coil 4 power is set as shown in FIG. 5C. In this example, the forced oscillation of voice coil 4 with sufficient amplitude and frequency can expend enough power to equal the average voice coil power during continuous operation. Accordingly, moving plate 1 with imprint template 2, also oscillates in the idle state.

When moving plate 1 is forced to oscillate as described above, the rms current driving the inertial motion can be made equal to the rms imprint current during continuous imprinting for oscillation about the $A_1$ position or any other convenient predetermined position between $C_1$ and $B_1$.

In yet another embodiment, during very long idle times, it may not be necessary to maintain the average electric current at all times. In this case, the imprint head 100 can be positioned at its idle position or natural equilibrium position, and then moved to the plane of equivalent current a predetermined time ahead of the scheduled imprint start time to heat the imprint head 100 to the equilibrium imprint temperature (for example, 1 hour). If a faster imprint start is desired, the moving plate 1 could be moved farther away from $A_1$ raising the current above the rms imprint current used during continuous imprinting for a period of time prior to applying the rms imprint current used during continuous imprinting. The advantage of this is faster heating of imprint head 100 to equilibrium temperature. Thus, the first several or more imprints after a cold start could benefit from overlay improvements.

A manufacturing method of a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus or imprint method described above. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is superior to a conventional method in at least one of the performance, quality, productivity, and production cost of the article.

While the present disclosure has been described with reference to exemplary embodiments, it is to be understood that the invention is not limited to the disclosed exemplary embodiments. The scope of the following claims is to be accorded the broadest interpretation to encompass all modifications, equivalent structures and functions.

What is claimed is:

1. An imprinting apparatus comprising:
   a mount attached to a fixed surface;
   a movable plate movable relative to the mount;
   an imprint template detachably mounted to the moveable plate;
   at least one electromagnetic actuator mounted between the movable plate and the mount; and
   a controller configured to:
   control movement of the moveable plate and the template toward or away from a substrate using the at least one electromagnetic actuator,
   apply, during an idle state, an electrical current to the at least one electromagnetic actuator to maintain the imprint template at a distance from a substrate, and
   apply, during a continuous imprinting state, an electrical current to the at least one electromagnetic actuator such that the imprint template contacts the substrate, wherein a root-mean-square of the electrical current applied to the at least one electromagnetic actuator during the idle state is equal to a root-mean-square of the electrical current applied to the at least one electromagnetic actuator during the continuous imprinting state.

2. The imprinting apparatus according to claim 1, wherein during the idle state the electrical current applied to the at least one electromagnetic actuator is constant.

3. The imprinting apparatus according to claim 2, wherein during the idle state the moveable plate is positionally fixed.

4. The imprinting apparatus according to claim 3, further comprising:
at least one spring mounted to the mount at one end and mounted to the movable plate at another end,
wherein force is applied by the at least one spring to stabilize the movable plate.

5. The imprinting apparatus according to claim 1, wherein during the idle state the electrical current applied to the at least one electromagnetic actuator is variable.

6. The imprinting apparatus according to claim 5, wherein during the idle state the moveable plate is retained in a fixed position.

7. The imprinting apparatus according to claim 5, wherein during the idle state the moveable plate oscillates.

8. The imprinting apparatus according to claim 5, further comprising:
at least one spring mounted to the mount at one end and mounted to the movable plate at another end,
wherein force is applied by the at least one spring to stabilize the movable plate.

9. A method for controlling an imprinting apparatus including, a mount attached to a fixed surface, a movable plate movable relative to the mount, an imprint template detachably mounted to the moveable plate, and at least one electromagnetic actuator mounted between the movable plate and mount, comprising:
controlling movement of the moveable plate and the template toward or away from a substrate using the at least one electromagnetic;
applying, during an idle state, an electrical current to the at least one electromagnetic actuator such that the imprint template maintains a distance from a substrate; and
applying, during a continuous imprinting state, an electrical current to the at least one electromagnetic actuator such that the imprint template contacts the substrate,
wherein a root-mean-square of the electrical current applied to the at least one electromagnetic actuator during the idle state is equal to a root-mean-square of the electrical current applied to the at least one electromagnetic actuator during the continuous imprinting state.

10. The method according to claim 9, wherein during the idle state the electrical current applied to the at least one electromagnetic actuator is constant.

11. The method according to claim 10, wherein during the idle state the moveable plate is positionally fixed.

12. The method according to claim 11, further comprising:
applying force to at least one spring mounted to the mount at one end and mounted to the movable plate at another end to stabilize the movable plate.

13. The method according to claim 9, wherein during the idle state the electrical current applied to the at least one electromagnetic actuator is variable.

14. The method according to claim 13, wherein during the idle state the moveable plate is retained in a fixed position.

15. The method according to claim 13, wherein during the idle state the moveable plate oscillates.

16. The method according to claim 13, further comprising:
applying force to at least one spring mounted to the mount at one end and mounted to the movable plate at another end to stabilize the movable plate.

17. A method of manufacturing an article, the method comprising:
forming a pattern on a substrate while controlling an imprint apparatus using a control method according to claim 9; and
processing the substrate on which the pattern has been formed.

18. An imprint method, the method comprising:
providing an imprint template on a moveable surface;
controlling movement of the movable surface and the imprint template toward or away from a substrate using at least one electromagnetic actuator;
applying, during an idle state, an electrical current to the at least one electromagnetic actuator to maintain the imprint template at a predetermined distance from a substrate; and
applying, during a continuous imprinting state, an electrical current to the at least one electromagnetic actuator such that the imprint template contacts the substrate,
wherein the root-mean-square of the electrical current applied to the at least one electromagnetic actuator during the idle state is equal to a root-mean-square of the electrical current applied to the at least one electromagnetic actuator during the continuous imprinting state.

19. The imprint method according to claim 18, wherein in the step of applying the electrical current during the idle state, the predetermined distance from the substrate varies over time based on start of the continuous printing state.

20. The imprint method according to claim 19, wherein in the step of applying the electrical current during the idle state, the moveable plate is at a predetermined distance from the substrate requiring the electrical current to the electromagnetic actuator to thermally heat the imprint template.

* * * * *